(12) United States Patent
Nakajima

(10) Patent No.: US 12,394,702 B2
(45) Date of Patent: Aug. 19, 2025

(54) WIRING BOARD

(71) Applicant: SHINKO ELECTRIC INDUSTRIES CO., LTD., Nagano (JP)

(72) Inventor: Takashi Nakajima, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 123 days.

(21) Appl. No.: 17/952,626

(22) Filed: Sep. 26, 2022

(65) Prior Publication Data

US 2023/0109322 A1 Apr. 6, 2023

(30) Foreign Application Priority Data

Sep. 27, 2021 (JP) .................................. 2021-157079

(51) Int. Cl.
    *H01L 23/498* (2006.01)
    *H01L 21/48* (2006.01)
    *H01L 23/00* (2006.01)

(52) U.S. Cl.
    CPC .... *H01L 23/49838* (2013.01); *H01L 21/4857* (2013.01); *H01L 23/49822* (2013.01);
    (Continued)

(58) Field of Classification Search
    CPC ...... H05K 1/0298; H05K 1/112; H05K 1/113; H05K 1/115; H01L 21/4857;
    (Continued)

(56) References Cited

U.S. PATENT DOCUMENTS

| 6,465,886 B1 | 10/2002 | Horiuchi et al. |
| 2011/0234964 A1* | 9/2011 | Moriwaki ........... G02F 1/13458 349/149 |

(Continued)

FOREIGN PATENT DOCUMENTS

| JP | S57-143891 A | 9/1982 |
| JP | S57-143891 U | 9/1982 |

(Continued)

OTHER PUBLICATIONS

The MicroFab Team, "SMD vs NSMD: Best Practices for BGA Pad Creation", Jun. 28, 2016; https://www.macrofab.com/blog/bga-pad-creation-smd-nsmd/ Visited Dec. 23, 2024 (Year: 2016).*

(Continued)

*Primary Examiner* — Timothy J Thompson
*Assistant Examiner* — Paramita Ghosh
(74) *Attorney, Agent, or Firm* — Rankin, Hill & Clark LLP

(57) ABSTRACT

A wiring board includes a first wiring layer including a wiring pattern and a pad, a first insulating layer that covers the first wiring layer and exposes, from an upper surfaces thereof, surfaces of the wiring pattern and the pad of the first wiring layer, a second insulating layer that is formed on the upper surface of the first insulating layer, an opening portion that penetrates through the second insulating layer to the pad of the first wiring layer, and a connecting terminal that is formed in the opening portion of the second insulating layer, that is connected to the pad of the first wiring layer, that has one end protruding from the opening portion of the second insulating layer, and that includes, at the one end, a top portion having a larger width than the pad of the first wiring layer.

8 Claims, 24 Drawing Sheets

(52) U.S. Cl.
CPC .............. *H01L 24/16* (2013.01); *H01L 24/32* (2013.01); *H01L 24/73* (2013.01); *H01L 2224/16227* (2013.01); *H01L 2224/32225* (2013.01); *H01L 2224/73204* (2013.01)

(58) Field of Classification Search
CPC ......... H01L 23/49838; H01L 23/49822; H01L 24/16; H01L 24/08; H01L 24/32; H01L 24/49; H01L 24/73; H01L 2224/16227; H01L 2224/32225; H01L 2224/73204
See application file for complete search history.

(56) References Cited

U.S. PATENT DOCUMENTS

| | | | |
|---|---|---|---|
| 2014/0076614 A1 | 3/2014 | Kobayashi et al. | |
| 2015/0016032 A1* | 1/2015 | Yun | H05K 5/13 361/679.01 |
| 2016/0088727 A1* | 3/2016 | Furutani | H05K 3/4673 174/262 |
| 2016/0192491 A1* | 6/2016 | Kang | H05K 1/113 174/262 |
| 2018/0047661 A1* | 2/2018 | Oshima | H01L 21/4857 |
| 2019/0333849 A1* | 10/2019 | Furuichi | H01L 21/4857 |

FOREIGN PATENT DOCUMENTS

| | | |
|---|---|---|
| JP | 2002-271027 A | 9/2002 |
| JP | 2010-093286 A | 4/2010 |
| JP | 2014-063801 A | 4/2014 |
| JP | 2016-063130 A | 4/2016 |
| JP | 2019-192885 A | 10/2019 |
| WO | 2011/007519 A1 | 1/2011 |

OTHER PUBLICATIONS

Japanese Office Action Corresponding to JP Application No. 2021-157079 dated Oct. 30, 2024, with English translation, 9 pages.
Japanese Office Action from Corresponding JP Application No. 2021-157079, dated Feb. 25, 2025, 8 pages.

* cited by examiner

WIRING BOARD

CROSS-REFERENCE TO RELATED APPLICATION

This application is based upon and claims the benefit of priority of the prior Japanese Patent Application No. 2021-157079, filed on Sep. 27, 2021, the entire contents of which are incorporated herein by reference.

FIELD

The embodiments discussed herein are related to a wiring board and a wiring board manufacturing method.

BACKGROUND

In general, a connecting terminal for an electronic component, such as a semiconductor chip, is formed on a wiring board on which the electronic component, such as the semiconductor chip, is to be mounted. From the viewpoint of preventing a short circuit failure with a wiring layer, in some cases, the connecting terminal may be arranged on another insulating layer that is different from an insulating layer that covers the wiring layer.

The wiring board including the connecting terminal as described above is manufactured by using, for example, a support body. Specifically, a wiring layer including a wiring pattern and a pad is formed on the support body, an insulating layer that covers the wiring layer is formed, the support body is subsequently removed, and a different insulating layer is laminated on an exposed surface of the exposed insulating layer. Further, a connecting terminal is formed by, for example, a semi-additive method on the different insulating layer from the insulating layer that covers the wiring layer. In other words, the connecting terminal is formed by forming, on the different insulating layer, an opening portion that penetrates to the pad of the wiring layer on the exposed surface of the insulating layer, and performing electrolytic copper plating in the opening portion of the different insulating layer, for example.

Patent Literature 1: Japanese Laid-open Patent Publication No. 2014-63801

However, in the wiring board in which the connecting terminal is provided on the different insulating layer from the insulating layer that covers the wiring layer, bond strength with an electronic component on the connecting terminal is not adequate, which is a problem.

In other words, in the wiring board as described above, it is common that a width of a top portion of the connecting terminal that protrudes from the opening portion of the different insulating layer is approximately the same as a width of the pad of the wiring layer that is exposed on a bottom portion of the opening portion. The pad of the wiring layer is arranged adjacent to the wiring pattern. Therefore, with a decrease in the width of the pad of the wiring layer due to miniaturization of arrangement of the wiring pattern, the width of the top portion of the connection terminal, which is the same as the width of the pad of the wiring layer, is reduced. As a result, a connection area between the top portion of the connecting terminal and an electrode of the electronic component is reduced, so that the bond strength with the electronic component on the connecting terminal may be reduced.

SUMMARY

According to an aspect of an embodiment, a wiring board includes a first wiring layer including a wiring pattern and a pad; a first insulating layer that covers the first wiring layer and exposes, from an upper surface thereof, surfaces of the wiring pattern and the pad of the first wiring layer; a second insulating layer that is formed on the upper surface of the first insulating layer; an opening portion that penetrates through the second insulating layer to the pad of the first wiring layer; and a connecting terminal that is formed in the opening portion of the second insulating layer, that is connected to the pad of the first wiring layer, that has one end protruding from the opening portion of the second insulating layer, and that includes, at the one end, a top portion having a larger width than the pad of the first wiring layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT(S)

Embodiments of a wiring board and a wiring board manufacturing method disclosed in the present application will be described in detail below based on the drawings. The disclosed technology is not limited by the embodiments below.

Embodiment

Figure 1:
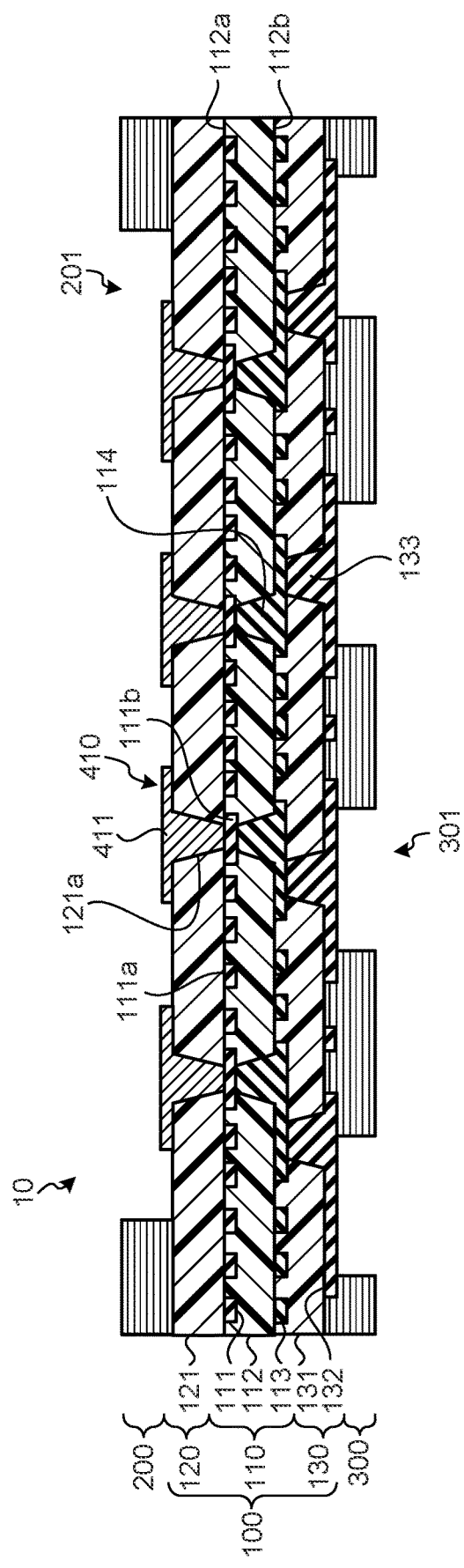
FIG. 1 is a diagram illustrating a configuration of a wiring board according to one embodiment.

FIG. 1 is a diagram illustrating a configuration of a wiring board 10 according to one embodiment. FIG. 1 schematically illustrates a cross section of the wiring board 10. The wiring board 10 illustrated in FIG. 1 may be used as a substrate of a semiconductor device on which a semiconductor chip is mounted, for example.

The wiring board 10 has a laminated structure and includes a build-up layer 100 and solder resist layers 200 and 300. The build-up layer 100 is divided into a first layer 110, a second layer 120, and a third layer 130. In the following, a case will be explained in which, as illustrated in FIG. 1, the solder resist layer 300 is a lowermost layer and the solder resist layer 200 is an uppermost layer; however, the wiring board 10 may be used, for example, in an upside-down manner or may be used in an arbitrary posture.

The first layer 110 is a layer that includes a first wiring layer 111 with conductive property, a first insulating layer 112 with insulating property, and a second wiring layer 113 with conductive property. The first wiring layer 111 is made of metal, such as coper or a copper alloy. The first wiring layer 111 includes wiring patterns 111a and pads 111b. The first insulating layer 112 covers a back surface (lower surface) and side surfaces of the first wiring layer 111, and surfaces of the wiring patterns 111a and the pads 111b of the first wiring layer 111 are exposed from an upper surface 112a of the first insulating layer 112. The first insulating layer 112 is made of insulating resin, such as epoxy resin, polyimide resin, or cyanate resin, that has heat resistance property, non-photosensitive property, and thermosetting property. The second wiring layer 113 is formed on a lower surface 112b of the first insulating layer 112. The second wiring layer 113 is made of metal, such as copper or a copper alloy. The second wiring layer 113 and the pads 111b of the first wiring layer 111 are connected to each other via vias 114 that penetrate through the first insulating layer 112.

The second layer 120 is a layer that is laminated on an upper part of the first layer 110 in an adjacent manner and that is formed of a second insulating layer 121 with insulating property. The second insulating layer 121 is formed on the upper surface 112a of the first insulating layer 112 so as to cover the exposed surfaces of the wiring patterns 111a and the pads 111b of the first wiring layer 111. The second insulating layer 121 is an outermost insulating layer at a side of an upper surface of the build-up layer 100. The second insulating layer 121 may be made of the same material as the first insulating layer 112, for example.

A surface of the build-up layer 100 at a side of the second layer 120 (that is, the second insulating layer 121) is a surface on which an electronic component, such as a semiconductor chip, is to be mounted, for example. Opening portions 121a are formed in the second insulating layer 121 at positions at which a semiconductor chip is to be mounted. The second insulating layer 121 is made of non-photosensitive thermosetting resin, and therefore, it is possible to form the opening portions 121a by laser processing.

In each of the opening portions 121a, a connecting terminal 410 for connecting one of the pads 111b of the first wiring layer 111 and an electrode of the semiconductor chip is formed. A top portion 411 of the connecting terminal 410, which protrudes from the opening portion 121a, has a larger width than the pad 111b of the first wiring layer 111, and extends to a predetermined range around the opening portion 121a on an upper surface of the second insulating layer 121.

The width of the top portion 411 of the connecting terminal 410 is larger than the width of the pad 111b of the first wiring layer 111, so that even if arrangement of the wiring pattern 111a is miniaturized and the width of the pad 111b is reduced, it is possible to prevent reduction in a surface area of the top portion 411 of the connecting terminal 410. Further, when a semiconductor chip is mounted on an upper part of the connecting terminal 410 for example, a contact area between the top portion 411 of the connecting terminal 410 and an electrode of the semiconductor chip is relatively large, so that it is possible to improve bond strength with the semiconductor chip on the connecting terminal 410. Meanwhile, the range in which the top portion 411 of the connecting terminal 410 extends on the upper surface of the second insulating layer 121 will be described later.

The third layer 130 is a layer that is laminated on a lower part of the first layer 110 in an adjacent manner and that is formed of a third insulating layer 131 with insulating property and a third wiring layer 132 with conductive property. The third insulating layer 131 is formed on the lower surface 112b of the first insulating layer 112 so as to cover the second wiring layer 113. The third insulating layer 131 is an outermost insulating layer at a side of a lower surface of the build-up layer 100. The third insulating layer 131 may be made of the same material as the first insulating layer 112, for example. The third wiring layer 132 is formed on a lower surface of the third insulating layer 131. The third wiring layer 132 may be made of the same material as the first wiring layer 111, for example. The third wiring layer 132 and the second wiring layer 113 that are adjacent to each other across the third insulating layer 131 are connected to each other if needed via vias 133 that penetrate through the third insulating layer 131.

The solder resist layer 200 is a layer that covers the second layer 120 that is the outermost layer at the side of the upper surface of the build-up layer 100. The solder resist layer 200 is a layer that is made of, for example, insulating photosensitive resin, such as acrylic resin and polyimide resin, and is one of insulating layers. Meanwhile, the solder resist layer 200 may be made of insulating non-photosensitive resin, such as epoxy resin, for example.

A surface of the wiring board 10 at a side of the solder resist layer 200 is, for example, an area that corresponds to a mounting surface of an electronic component, such as a semiconductor chip. An opening portion 201 is formed in the solder resist layer 200 at a position corresponding to the mounting surface of the semiconductor chip, and the top portions 411 of the connecting terminals 410 are exposed on a bottom surface of the opening portion 201. If the solder resist layer 200 is made of photosensitive resin, it is possible to form the opening portion 201 by exposure and development. Further, if the solder resist layer 200 is made of non-photosensitive resin, it is possible to form the opening portion 201 by laser processing.

The solder resist layer 300 is a layer that covers the third wiring layer 132 of the third layer 130, which is the outermost layer at the side of the lower surface of the build-up layer 100, and that protects the wiring. The solder resist layer 300 is a layer that is made of, for example, insulating photosensitive resin, such as acrylic resin and polyimide resin, and is one of insulating layers. Meanwhile, the solder resist layer 300 may be made of insulating non-photosensitive resin, such as epoxy resin, for example.

A surface of the wiring board 10 at a side of the solder resist layer 300 is a surface that is connected to an external component, an external device, or the like. An opening portion 301 is formed in the solder resist layer 300 at a position at which an external connecting terminal for electrically connecting an external component or an external device is formed, and the third wiring layer 132 of the third layer 130 of the build-up layer 100 is exposed from the opening portion 301. An external connecting terminal, such as a solder ball, may be formed in the opening portion 301, for example. Further, a portion of the third wiring layer 132 exposed from the opening portion 301 may be used as an external connecting terminal without providing a solder ball. If the solder resist layer 300 is made of photosensitive resin, it is possible to form the opening portion 301 by exposure and development. Further, if the solder resist layer 300 is made of non-photosensitive resin, it is possible to form the opening portion 301 by laser processing.

Figure 2:
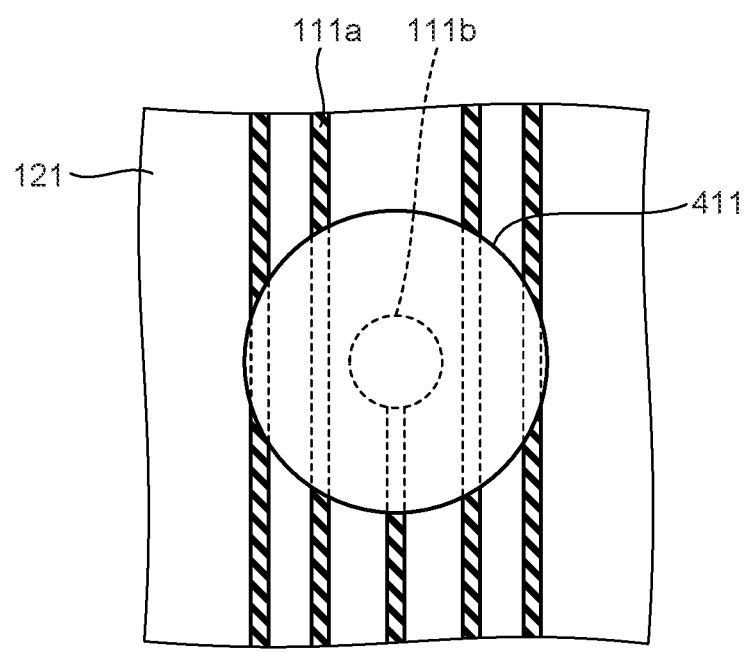
FIG. 2 is an enlarged perspective plan view of a periphery of a top portion of a connecting terminal on an upper surface of a second insulating layer.

The range in which the top portion 411 of the connecting terminal 410 extends on the upper surface of the second insulating layer 121 will be described below with reference to FIG. 2. FIG. 2 is an enlarged perspective plan view of a periphery of the top portion 411 of the connecting terminal 410 on the upper surface of the second insulating layer 121. The second insulating layer 121 is formed on the upper surface 112a of the first insulating layer 112, and covers the exposed surfaces of the wiring patterns 111a and the pads 111b of the first wiring layer 111 that are exposed on the upper surface 112a of the first insulating layer 112. In the perspective plan view of FIG. 2, the exposed surfaces of the wiring patterns 111a and the pad 111b of the first wiring layer 111 covered by the second insulating layer 121 are illustrated. Further, as illustrated in FIG. 2 for example, if the plurality of wiring patterns 111a are located around one of the pads 111b, the top portion 411 of the connecting terminal 410 extends to a position overlapping with at least one of the wiring patterns 111a on the upper surface of the second insulating layer 121 in a plan view. A diameter of the pad 111b of the first wiring layer 111 is in a range of, for example, equal to or larger than 60 micrometers (μm) and equal to or smaller than 120 μm, and a diameter of the top portion 411 of the connecting terminal 410 is, for example, equal to or larger than 80 μm. Further, a pitch between the plurality of wiring patterns 11a located around the pad 111b is in a range of, for example, equal to or larger than 10 μm and equal to or smaller than 40 μm, and a pitch between each of the wiring patterns 111a and the pad 111b is in a range of, for example, equal to or larger than 8 μm and equal to or smaller than 12 μm. For example, if the diameter of the pad 111b is 60 μm, if a pitch between the plurality of wiring patterns 111a is 10 μm, and if the diameter of the top portion 411 of the connecting terminal 410 is 80 μm, the top portion 411 of the connecting terminal 410 overlaps with the two wiring patterns 111a that sandwich the pad 111b in a plan view. Furthermore, for example, if the diameter of the pad 111b is 60 μm, if a pitch between the plurality of wiring patterns 111a is 10 μm, and if the diameter of the top portion 411 of the connecting terminal 410 is 100 μm, the top portion 411 of the connecting terminal 410 overlaps with the four wiring patterns 111a that sandwich the pad 111b in a plan view. FIG. 2 illustrates the state in which the top portion 411 of the connecting terminal 410 overlaps with the four wiring patterns 111a that sandwich the pad 111b in a plan view.

In this manner, the top portion 411 of the connecting terminal 410 extends to a position overlapping with at least one of the wiring patterns 11a in a plan view, so that it is possible to increase the surface area of the top portion 411 of the connecting terminal 410. As a result, the connection area between the top portion 411 of the connecting terminal 410 and the electrode of the semiconductor chip is increased, so that it is possible to improve bond strength between the connecting terminal 410 and the semiconductor chip.

Figure 3:
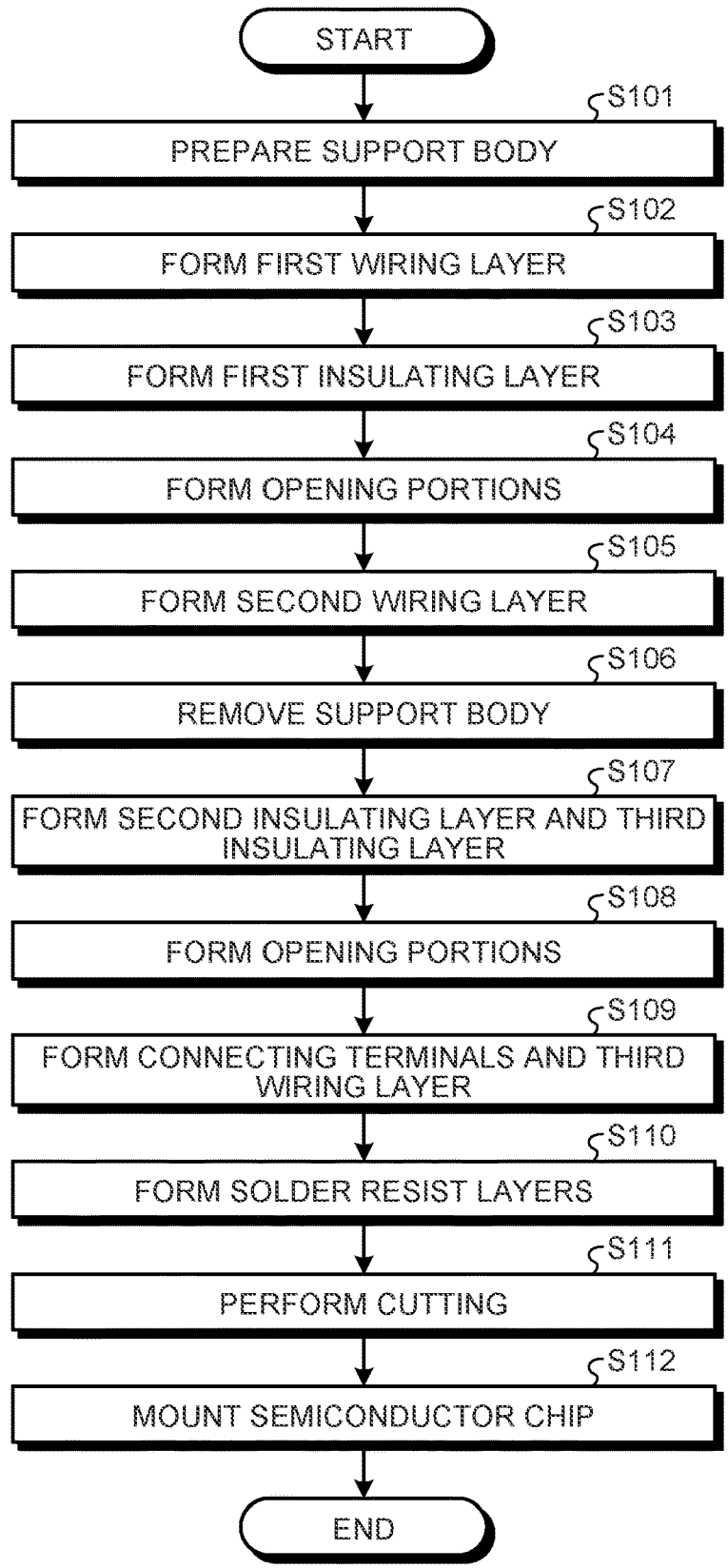
FIG. 3 is a flowchart illustrating an example of the flow of a semiconductor device manufacturing method according to the embodiment.

A method of manufacturing a semiconductor device including the wiring board 10 configured as described above will be described below using a specific example with reference to FIG. 3. FIG. 3 is a flowchart illustrating an example of the flow of a semiconductor device manufacturing method according to the embodiment.

Figure 4:
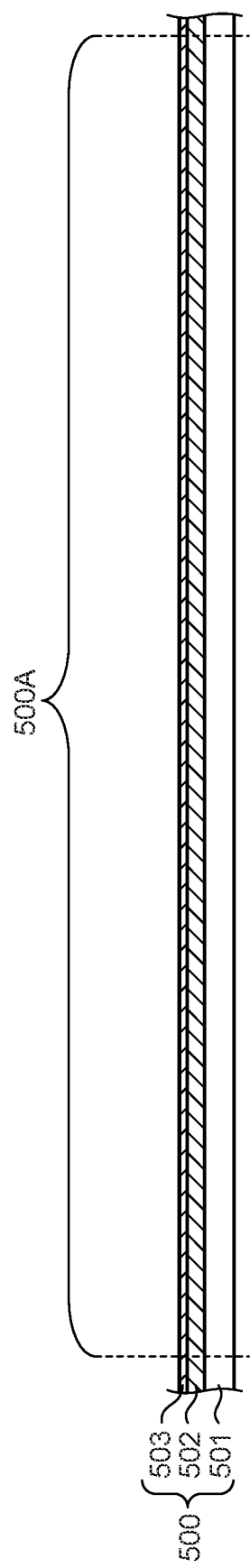
FIG. 4 is a diagram illustrating a specific example of a support body.

First, a support body 500 that serves as a base for manufacturing the wiring board 10 is prepared (Step S101). Specifically, as illustrated in FIG. 4 for example, the support body 500 is provided by sequentially forming a first metal layer 502 and a second metal layer 503 on a flat upper surface of a base material 501. FIG. 4 is a diagram illustrating a specific example of the support body 500. The base material 501 is, for example, a prepreg in which epoxy insulating resin or the like is impregnated in a reinforcing member, such as a woven fabric or a non-woven fabric, which is made of a glass fiber, an aramid fiber, or the like. The first metal layer 502 is, for example, a metallic foil that is made of copper and includes a peeling layer (not illustrated) on an upper surface thereof. The second metal layer 503 is, for example, a metallic foil that is made of copper and is laminated on the first metal layer 502 via the peeling layer (not illustrated).

Meanwhile, a plurality of wiring board formation areas 500A are arranged in a lattice manner on the support body 500, and a wiring board 10 is formed in an area corresponding to each of the wiring board formation areas 500A, for example. In other words, the plurality of wiring boards 10 are formed by using the single support body 500.

Figure 5:
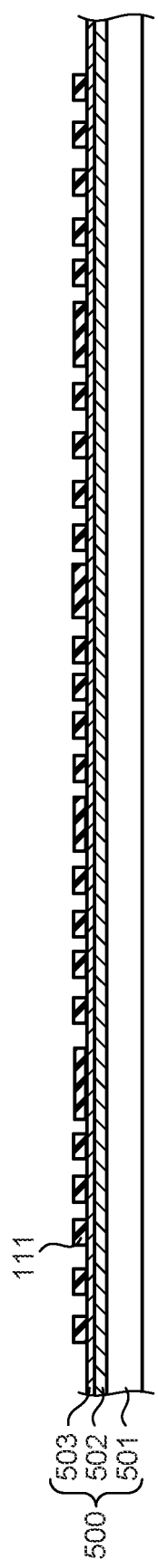
FIG. 5 is a diagram illustrating a specific example of a process of forming a first wiring layer.

After the support body 500 is prepared, the first wiring layer 111 is formed on the second metal layer 503 (Step S102). Specifically, a plating resist layer on which openings are formed in wiring pattern formation portions and pad formation portions is formed on the second metal layer 503, electrolytic copper plating is performed on the second metal layer 503 that is exposed from the openings in the plating resist layer for example, and an electroplating layer is formed. The plating resist layer is formed by using, for example, dry film resist, and the openings in the plating resist layer may be formed by photolithography or laser processing, for example. Thereafter, as illustrated in FIG. 5 for example, the plating resist layer is removed by a stripping solution, so that the first wiring layer 111 including the wiring patterns 111a and the pads 111b is formed. FIG. 5 is a diagram illustrating a specific example of a process of forming the first wiring layer.

Figure 6:
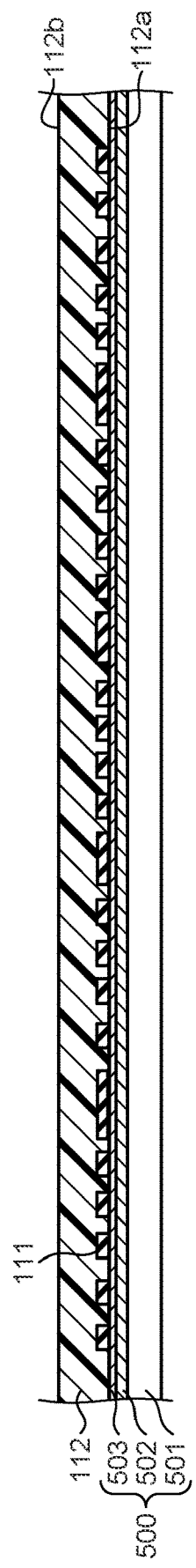
FIG. 6 is a diagram illustrating a specific example of a process of forming a first insulating layer.

After the first wiring layer 111 is formed, the first insulating layer 112 that covers the first wiring layer 111 is formed on the second metal layer 503 (Step S103). Specifically, as illustrated in FIG. 6 for example, the first insulating layer 112 that is made of non-photosensitive and thermosetting resin with heat resistant property, such as epoxy resin, polyimide resin, or cyanate resin, is formed on the second metal layer 503 so as to cover the first wiring layer 111. FIG. 6 is a diagram illustrating a specific example of a process of forming the first insulating layer. The first insulating layer 112 is formed in an upside-down manner on the second metal layer 503. Specifically, a surface of the first insulating layer 112 that comes in contact with the second metal layer 503 serves as the upper surface 112a, and a surface of the first insulating layer 112 located opposite to the second metal layer 503 serves as the lower surface 112b.

Figure 7:
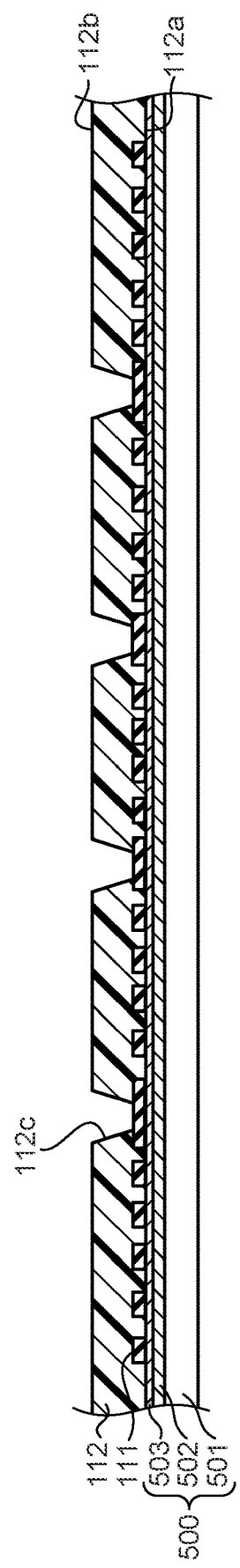
FIG. 7 is a diagram illustrating a specific example of a process of forming opening portions.

Opening portions are formed at positions at which the vias 114 are to be formed on the first insulating layer 112 (Step S104). Specifically, as illustrated in FIG. 7 for example, an opening portions 112c that penetrate through the first insulating layer 112 and reach the pads 111b of the first wiring layer 111 are formed by, for example, laser processing. FIG. 7 is a diagram illustrating a specific example of a process of forming the opening portions. The pads 111b of the first wiring layer 111 are exposed on bottom surfaces of the opening portion 112c. Each of the opening portions 112c has a tapered shape in which a width (diameter) is reduced from the lower surface 112b of the first insulating layer 112 to the pad 111b of the first wiring layer 111.

Then, the second wiring layer 113 is formed on the first insulating layer 112 on which the opening portions 112c are formed (Step S105). The second wiring layer 113 is formed by, for example, a semi-additive method. In this case, a seed layer is formed by, for example, performing electroless copper plating on inner wall surfaces of the opening portions 112c and the lower surface 112b of the first insulating layer 112. Subsequently, a plating resist layer in which openings are arranged in the wiring pattern formation portions is formed on the seed layer. Then, for example, electrolytic copper plating is performed on the seed layer that is exposed from the openings of the plating resist layer, so that an electroplating layer is formed. Subsequently, the plating resist layer is removed. Thereafter, the seed layer that is exposed from the electroplating layer is removed, so that the second wiring layer 113 with a desired wiring pattern is formed on the lower surface 112b of the first insulating layer 112.

Figure 8:
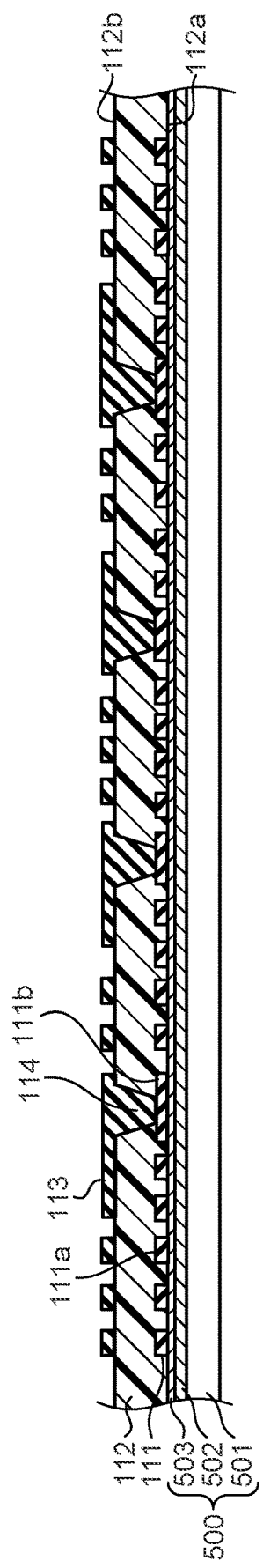
FIG. 8 is a diagram illustrating a specific example of a process of forming a second wiring layer.

At this time, as illustrated in FIG. 8 for example, the opening portions 112c in the first insulating layer 112 are filled with electrolytic copper plating, so that the vias 114 that penetrate through the first insulating layer 112 are formed, and the second wiring layer 113 and the pads 111b of the first wiring layer 111 are connected to each other via the vias 114. FIG. 8 is a diagram illustrating a specific example of a process of forming the second wiring layer. Each of the opening portions 112c has a tapered shape in which the width (diameter) is reduced from the lower surface 112b of the first insulating layer 112 to the pad 111b of the first wiring layer 111, and therefore, each of the vias 114 has a tapered shape that conforms to the opening portion 112c. In other words, each of the vias 114 has a tapered shaped in which a width (diameter) is reduced from the second wiring layer 113 on the lower surface 112b of the first insulating layer 112 to the pad 111b of the first wiring layer 111.

With formation of the second wiring layer 113, the first layer 110 of the build-up layer 100 is obtained. In other words, the first layer 110, in which the first wiring layer 111, the first insulating layer 112, and the second wiring layer 113 are formed, is formed on the support body 500.

Figure 9:
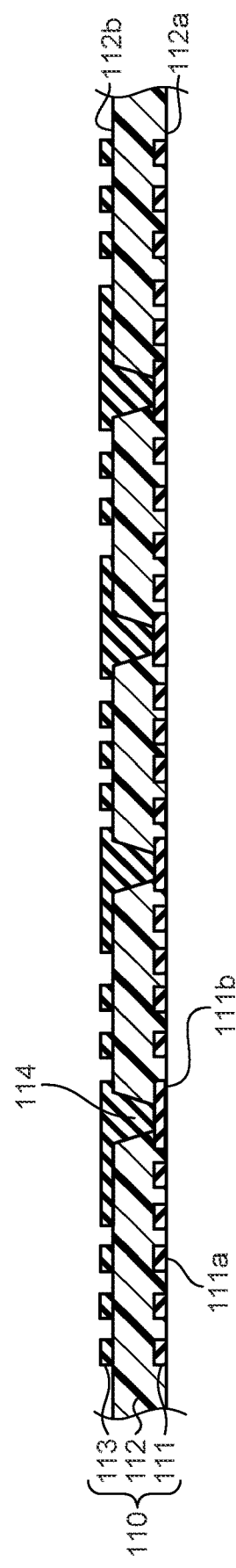
FIG. 9 is a diagram illustrating a specific example of a process of removing a support body.

After the first layer 110 is formed, the support body 500 is removed from the first layer 110 (Step S106). Specifically, first, an upper layer above the second metal layer 503 is peeled off from the peeling layer (not illustrated) of the first metal layer 502, and subsequently, the second metal layer 503 that comes in contact with the upper surface 112a of the first insulating layer 112 is removed by etching. Accordingly, as illustrated in FIG. 9 for example, the upper surface 112a of the first insulating layer 112 is exposed, and the wiring patterns 111a and the pads 111b of the first wiring layer 111 are exposed on the upper surface 112a of the first insulating layer 112. FIG. 9 is a diagram illustrating a specific example of a process of removing the support body.

Figure 10:
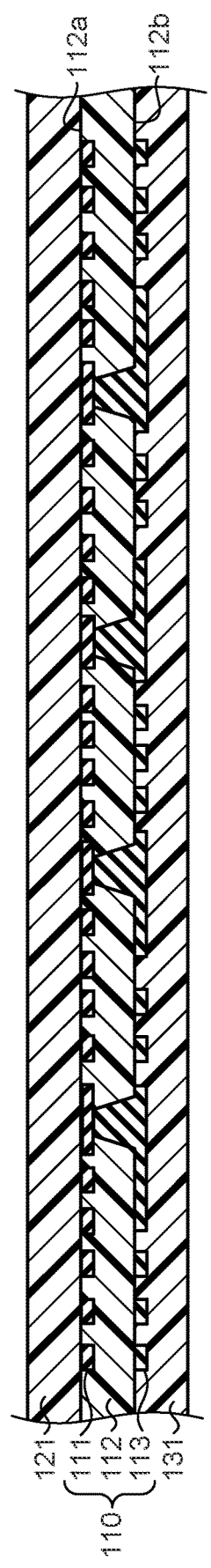
FIG. 10 is a diagram illustrating a specific example of a process of forming a second insulating layer and a third insulating layer.

After the support body 500 is removed, the second insulating layer 121 is formed on the upper surface 112a of the first insulating layer 112, and the third insulating layer 131 is formed on the lower surface 112b of the first insulating layer 112 (Step S107). Specifically, as illustrated in FIG. 10 for example, the second insulating layer 121 that is made of non-photosensitive and thermosetting resin with heat resistant property, such as epoxy resin, polyimide resin, or cyanate resin, is laminated on the upper surface 112a of the first insulating layer 112. Further, the third insulating layer 131 that is made of non-photosensitive and thermosetting resin with heat resistant property, such as epoxy resin, polyimide resin, or cyanate resin, is laminated on the lower surface 112b of the first insulating layer 112. FIG. 10 is a diagram illustrating a specific example of a process of forming the second insulating layer and the third insulating layer. In FIG. 10, the structural body illustrated in FIG. 9 is illustrated in an upside-down manner. Meanwhile, the second insulating layer 121 and the third insulating layer 131 need not always be formed in parallel, but may be formed in arbitrary order.

Figure 11:
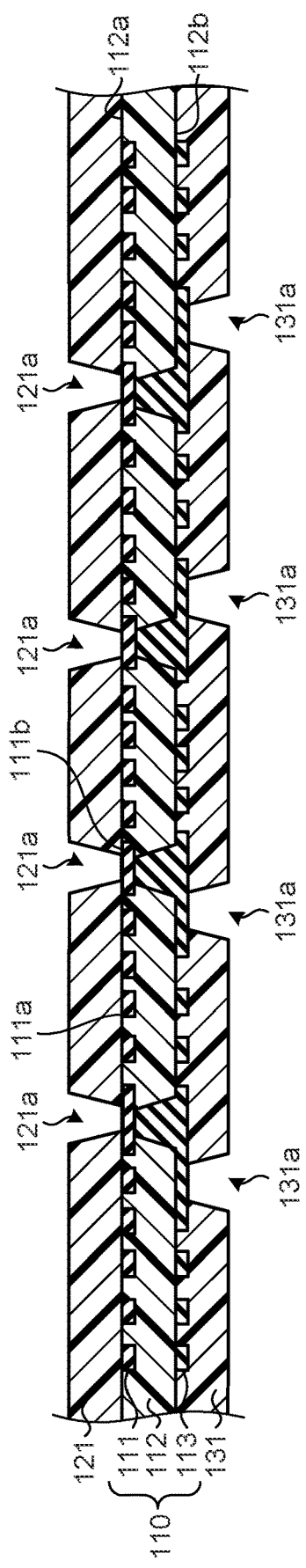
FIG. 11 is a diagram illustrating a specific example of a process of forming opening portions.

Then, as illustrated in FIG. 11 for example, the opening portions 121a are formed by, for example, laser processing at positions at which the connecting terminals 410 for a semiconductor chip are arranged on the second insulating layer 121 at a side at which the semiconductor chip is to be mounted (Step S108). FIG. 11 is a diagram illustrating a specific example of a process of forming the opening portions. The pads 111b of the first wiring layer 111 are exposed on the bottom surfaces of the opening portions 121a. Each of the opening portions 121a has a tapered shaped in which the width (diameter) is reduced from the upper surface of the second insulating layer 121 to the pad 111b of the first wiring layer 111. In contrast, opening portions 131a are formed by, for example, laser processing at positions at which the vias 133 of the third insulating layer 131 are formed. The second wiring layer 113 is exposed on bottom surfaces of the opening portions 131a. Each of the opening portions 131a has a tapered shaped in which a width (diameter) is reduced from a lower surface of the third insulating layer 131 to the second wiring layer 113. Meanwhile, the opening portions 121a and the opening portions 131a need not always be formed in parallel, but may be formed in arbitrary order.

Figure 12:
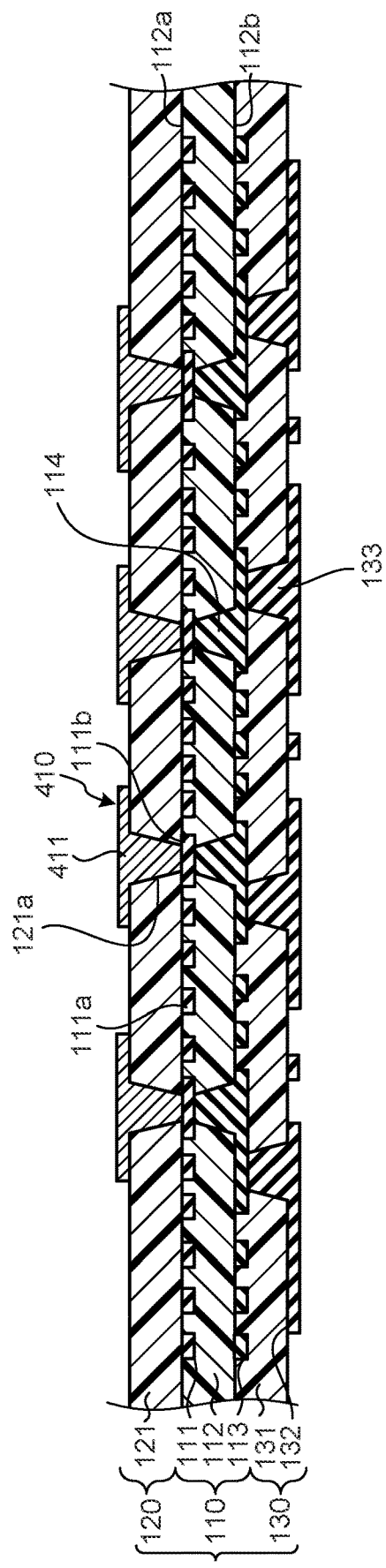
FIG. 12 is a diagram illustrating a specific example of a process of forming connecting terminals and a third wiring layer.

Further, the connecting terminals 410 are formed in the opening portions 121a of the second insulating layer 121, and the third wiring layer 132 is formed on the lower surface of the third insulating layer 131 (Step S109). The connecting terminals 410 are formed by, for example, a semi-additive method. Specifically, a seed layer is formed by, for example, performing electroless copper plating on inner wall surfaces of the opening portions 121a and the upper surface of the second insulating layer 121. Subsequently, a plating resist layer in which openings are arranged in connecting terminal formation portions is formed on the seed layer. Then, for example, electrolytic copper plating is performed on the seed layer that is exposed from the openings of the plating resist layer, so that an electroplating layer is formed. Subsequently, the plating resist layer is removed. Thereafter, the seed layer that is exposed from the electroplating layer is removed by etching, so that the connecting terminals 410 are formed. As illustrated in FIG. 12 for example, the connecting terminals 410 are connected to the pads 111b of the first wiring layer 111 at the positions of the opening portions 121a in the second insulating layer 121. FIG. 12 is a diagram illustrating a specific example of a process of forming the connecting terminals and the third wiring layer.

At the time of forming the connecting terminals 410, the top portions 411 that have larger widths (diameters) than the pads 111b of the first wiring layer 111 are formed on the upper surface of the second insulating layer 121. In other words, the electrolytic copper plating is deposited so as to extend to a predetermined range around each of the opening portions 121a on the upper surface of the second insulating layer 121, so that the top portion 411 with a larger width (diameter) than the pad 111b of the first wiring layer 111 is formed. For example, when the plurality of wiring patterns 111a are located around the pad 111b of the first wiring layer 111, the top portion 411 of the connecting terminal 410 extends to a position overlapping with at least one of the wiring patterns 111a on the upper surface of the second insulating layer 121 in a plan view. With this configuration, the surface area of the top portion 411 of the connecting terminal 410 becomes larger than a surface area of the pad 111b of the first wiring layer 111. As a result, when a semiconductor chip is mounted above the connecting terminals 410 for example, a contact area between each of the top portions 411 of the connecting terminals 410 and each of electrodes of the semiconductor chip is relatively large, so that it is possible to improve bond strength with the semiconductor chip on the connecting terminals 410.

Furthermore, each of the opening portions 121a has a tapered shape in which the width (diameter) is reduced from the upper surface of the second insulating layer 121 to the pad 111b of the first wiring layer 111, so that a portion of the connecting terminal 410 located inside the opening portion 121a has a tapered shape that conforms to the opening portion 121a. In other words, the portion of the connecting terminal 410 located inside the opening portion 121a has the tapered shape in which the width (diameter) is reduced from the top portion 411 to the pad 111b of the first wiring layer 111. The tapered shape of the portion of the connecting terminal 410 located inside the opening portion 121a is an inverted tapered shaped as compared to the tapered shape of the via 114 that connects the second wiring layer 113 and the pad 111b of the first wiring layer 111. With this configuration, even if the width (diameter) of the pad 111b of the first wiring layer 111 is relatively small, it is possible to reliably connect the connecting terminal 410 and the via 114 to the pad 111b, so that it is possible to improve miniaturization of arrangement of the wiring patterns 111a around the pad 111b.

In contrast, the third wiring layer 132 is formed by a semi-additive method, similarly to the connecting terminals 410. In this case, as illustrated in FIG. 12 for example, the opening portions 131a of the third insulating layer 131 are filled with electrolytic copper plating, so that the vias 133 that penetrate through the third insulating layer 131 are formed, and the third wiring layer 132 and the second wiring layer 113 are connected to each other via the vias 133. Meanwhile, the connecting terminals 410 and the third wiring layer 132 need not always be formed in parallel, but may be formed in arbitrary order.

With formation of the connecting terminals 410 and the third wiring layer 132, the build-up layer 100 that includes the first layer 110 to the third layer 130 is completed. Further, the second layer 120 that is the outermost layer at the side of the upper surface of the build-up layer 100 is covered by the solder resist layer 200, and the third wiring layer 132 of the third layer 130 that is the outermost layer at the side of the lower surface of the build-up layer 100 is covered by the solder resist layer 300 (Step S110).

Figure 13:
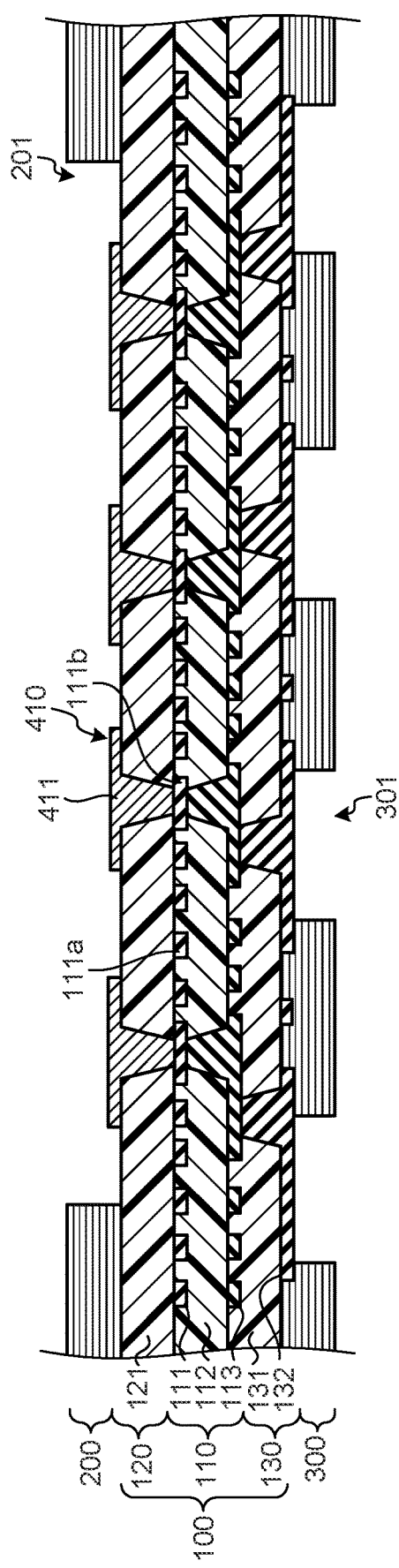
FIG. 13 is a diagram illustrating a specific example of a process of forming solder resist layers.

Furthermore, as illustrated in FIG. 13 for example, the opening portion 201 is formed at a position corresponding to a mounting surface of a semiconductor chip on the solder resist layer 200 at a side corresponding to the mounting surface of the semiconductor chip. The top portions 411 of the connecting terminals 410 are exposed on the bottom surface of the opening portion 201. In contrast, the opening portion 301 is formed at a position at which an external connecting terminal is arranged on the solder resist layer 300 at a side at which an external component, an external device, or the like is to be connected. The third wiring layer 132 is exposed on a bottom surface of the opening portion 301. FIG. 13 is a diagram illustrating a specific example of a process of forming the solder resist layers.

If photosensitive resin is used as the solder resist layers 200 and 300, it is possible to form the opening portions 201 and 301 by exposure and development. Further, if non-photosensitive resin is used as the solder resist layers 200 and 300, it is possible to form the opening portions 201 and 301 by laser processing.

Figure 14:
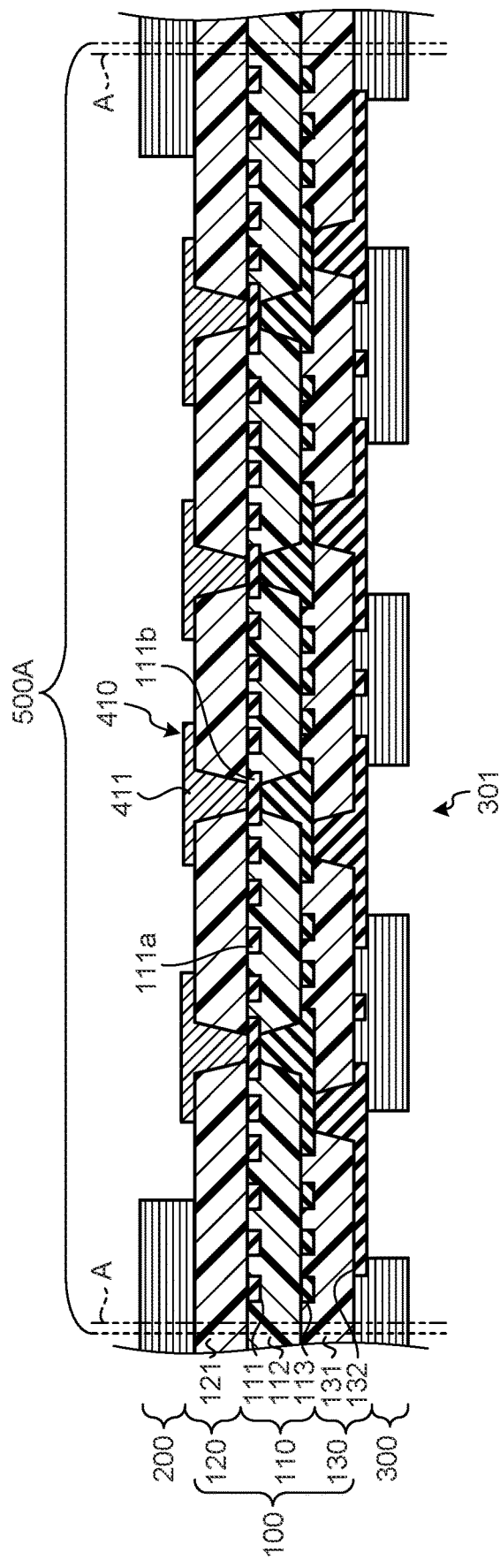
FIG. 14 is a diagram illustrating a specific example of a cutting process.

Through the processes as described above, as illustrated in FIG. 14 for example, an intermediate structure that has the same structure as the wiring board 10 is obtained. The intermediate structure is configured with an assembly that includes the plurality of wiring boards 10, and therefore, cutting is performed to cut out each of the wiring boards 10 (Step S111). Specifically, the intermediate structure as illustrated in FIG. 14 is cut by, for example, a dicer or a slicer along cutting lines A that are located inside the area corresponding to each of the wiring board formation areas 500A, so that the wiring board 10 is obtained. FIG. 14 is a diagram illustrating a specific example of a cutting process.

Figure 15:
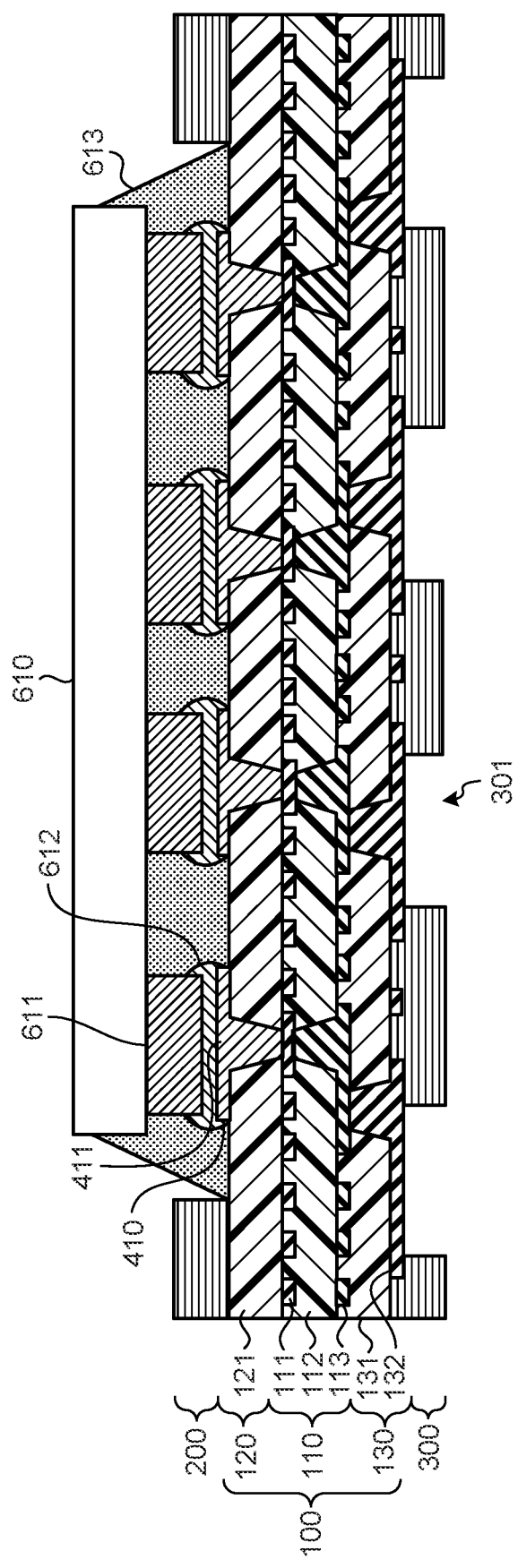
FIG. 15 is a diagram illustrating a specific example of a process of mounting a semiconductor chip.

Further, a semiconductor chip is mounted on the build-up layer 100 at the side of the second layer 120 (that is, the second insulating layer 121) (Step S112), and the connecting terminals 410 and electrodes of the semiconductor chip are connected to each other. FIG. 15 is a diagram illustrating a specific example of a process of mounting a semiconductor chip.

Specifically, as illustrated in FIG. 15, a semiconductor chip 610 is mounted above the connecting terminals 410, and electrodes 611 of the semiconductor chip 610 are bonded to the top portions 411 of the connecting terminals 410 by, for example, solders 612 or the like. At this time, the width of each of the top portions 411 of the connecting terminals 410 is larger than the width of each of the pads 111b of the first wiring layer 111, so that a connection area between each of the top portions 411 of the connecting terminals 410 and each of the electrodes 611 of the semiconductor chip 610 is increased. As a result, it is possible to improve bond strength between the connecting terminals 410 and the semiconductor chip 610. Further, at this time, each of the top portions 411 of the connecting terminals 410 protrudes upward relative to the upper surface of the second insulating layer 121, so that an upper surface and side surfaces of each of the top portions 411 are covered by the solder 612.

Furthermore, bonded portions between the electrodes 611 and the top portions 411 of the connecting terminals 410 are sealed with underfill resin 613, so that a semiconductor device in which the semiconductor chip 610 is mounted on the wiring board 10 is completed. In the bonded portions between the electrodes 611 and the top portions 411 of the connecting terminals 410, the upper surfaces and the side surfaces of the top portions 411 are covered by the solders 612. Therefore, in the semiconductor device, as compared to a configuration in which the top portions 411 are embedded in the second insulating layer 121 and only the upper surfaces of the top portions 411 are covered by solders, it is possible to improve the bond strength between the electrodes 611 and the top portions 411 of the connecting terminals 410. Meanwhile, it may be possible to form an external connecting terminal, such as a solder ball, in the opening portion 301 of the solder resist layer 300. Moreover, it may be possible to use a portion of the third wiring layer 132 exposed from the opening portion 301 of the solder resist layer 300 as an external connecting terminal without providing a solder ball.

As described above, a wiring board (for example, the wiring board 10) according to the embodiment includes a first wiring layer (for example, the first wiring layer 111), a first insulating layer (for example, the first insulating layer 112), a second insulating layer (for example, the second insulating layer 121), an opening portion (for example, the opening portion 121a), and a connecting terminal (for example, the connecting terminal 410). The first wiring layer includes a wiring pattern (for example, the wiring pattern 111a) and a pad (for example, the pad 111b). The first insulating layer covers the first wiring layer and exposes, from an upper surface (for example, the upper surface 112a), surfaces of the wiring pattern and the pad of the first wiring layer. The second insulating layer is formed on the upper surface of the first insulating layer. The opening portion penetrates through the second insulating layer to the pad of the first wiring layer. The connecting terminal is formed in the opening portion of the second insulating layer, is connected to the pad of the first wiring layer, has one end that protrudes from the opening portion of the second insulating layer, and includes, at the one end, a top portion (for example, the top portion 411) that has a larger width than the pad of the first wiring layer. With this configuration, according to the wiring board of the embodiment, it is possible to improve bond strength with an electronic component (for example, the semiconductor chip 610).

Furthermore, in the wiring board according to the embodiment, the first wiring layer may include a plurality of wiring patterns that are located around the pad. Moreover, the top portion of the connecting terminal may extend to a position overlapping with at least one of the wiring patterns on the upper surface of the second insulating layer in a plan view. With this configuration, according to the wiring board of the embodiment, it is possible to improve the bond strength with the electronic component.

Furthermore, the wiring board according to the embodiment may further include a second wiring layer (for example, the second wiring layer 113) and a via (for example, the via 114). The second wiring layer may be formed on a lower surface (for example, the lower surface 112b) of the first insulating layer. The via may penetrate through the first insulating layer and connect the second wiring layer and the pad of the first wiring layer. With this configuration, according to the wiring board of the embodiment, it is possible to electrically connect the second wiring layer and the pad of the first wiring layer that are located adjacent to each other across the first insulating layer.

Moreover, in the wiring board according to the embodiment, a portion of the connecting terminal located inside the opening portion of the second insulating layer may have a tapered shape in which a width is reduced from the top portion to the pad of the first wiring layer. The via may have a tapered shape in which a width is reduced from the second wiring layer to the pad of the first wiring layer. With this configuration, according to the wiring board of the embodiment, it is possible to improve miniaturization of arrangement of the wiring patterns around the pad.

Furthermore, the wiring board according to the embodiment may further include a third insulating layer (for example, the third insulating layer 131), a third wiring layer (for example, the third wiring layer 132), and a via (for example, the via 133). The third insulating layer may be formed on a lower surface of the first insulating layer and cover the second wiring layer. The third wiring layer may be formed on a lower surface of the third insulating layer. The via may penetrate through the third insulating layer and connect the third wiring layer and the second wiring layer. With this configuration, according to the wiring board of the embodiment, it is possible to appropriately adjust the number of layers in the build-up layer (for example, the build-up layer 100) that is configured by laminating layers formed of an insulating layer and a wiring layer.

Modification

Figure 16:
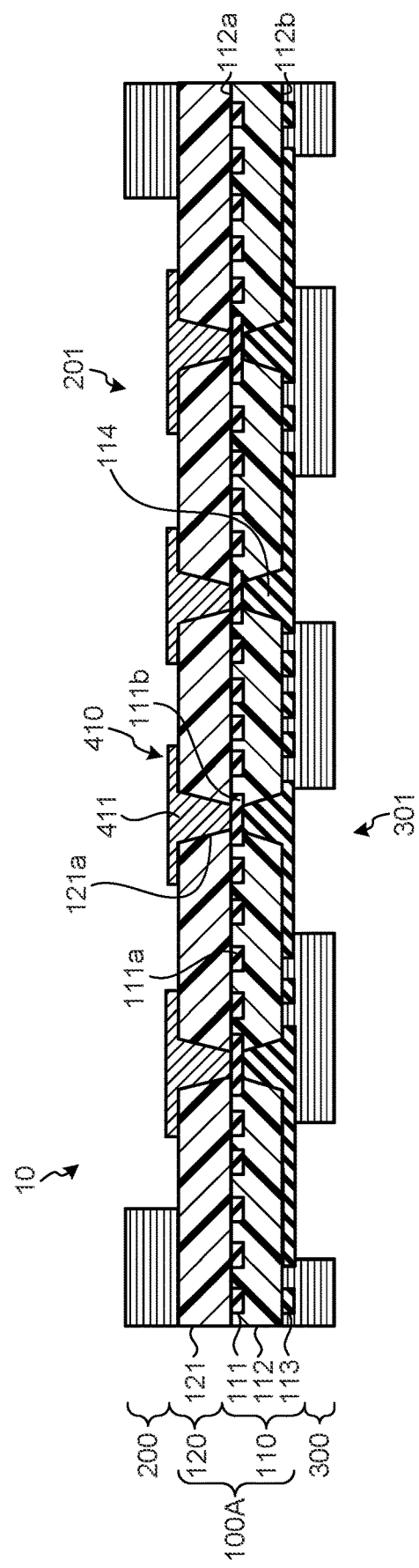
FIG. 16 is a diagram illustrating a configuration of a wiring board according to a modification.

FIG. 16 is a diagram illustrating a configuration of the wiring board 10 according to a modification. In FIG. 16, the same components as those illustrated in FIG. 1 are denoted by the same reference symbols. FIG. 16 schematically illustrates a cross section of the wiring board 10. The wiring board 10 illustrated in FIG. 16 has a laminated structure, and includes a build-up layer 100A and the solder resist layers 200 and 300. The build-up layer 100A is divided into the first layer 110 and the second layer 120.

In the embodiment as described above, the build-up layer 100 is configured such that the second layer 120 is laminated on an upper part of the first layer 110 and the third layer 130 is laminated on a lower part of the first layer 110. In contrast, in the wiring board 10 according to the modification, the build-up layer 100A does not include the third layer 130, but includes the two layers. Therefore, the first insulating layer 112 of the first layer 110 is the outermost insulating layer at a side of a lower surface of the build-up layer 100A.

The solder resist layer 300 is a layer that covers the second wiring layer 113 of the first layer 110 that is the outermost layer at the side of the lower surface of the build-up layer 100A, and protects wires.

A surface of the wiring board 10 at a side of the solder resist layer 300 is a surface that is connected to an external component, an external device, or the like. The opening portion 301 is formed in the solder resist layer 300 at a position at which an external connecting terminal for electrically connecting an external component or an external device is formed, and the second wiring layer 113 of the first layer 110 of the build-up layer 100A is exposed from the opening portion 301. An external connecting terminal, such as a solder ball, may be formed in the opening portion 301, for example. Further, a portion of the second wiring layer 113 exposed from the opening portion 301 may be used as an external connecting terminal without providing a solder ball.

Figure 17:
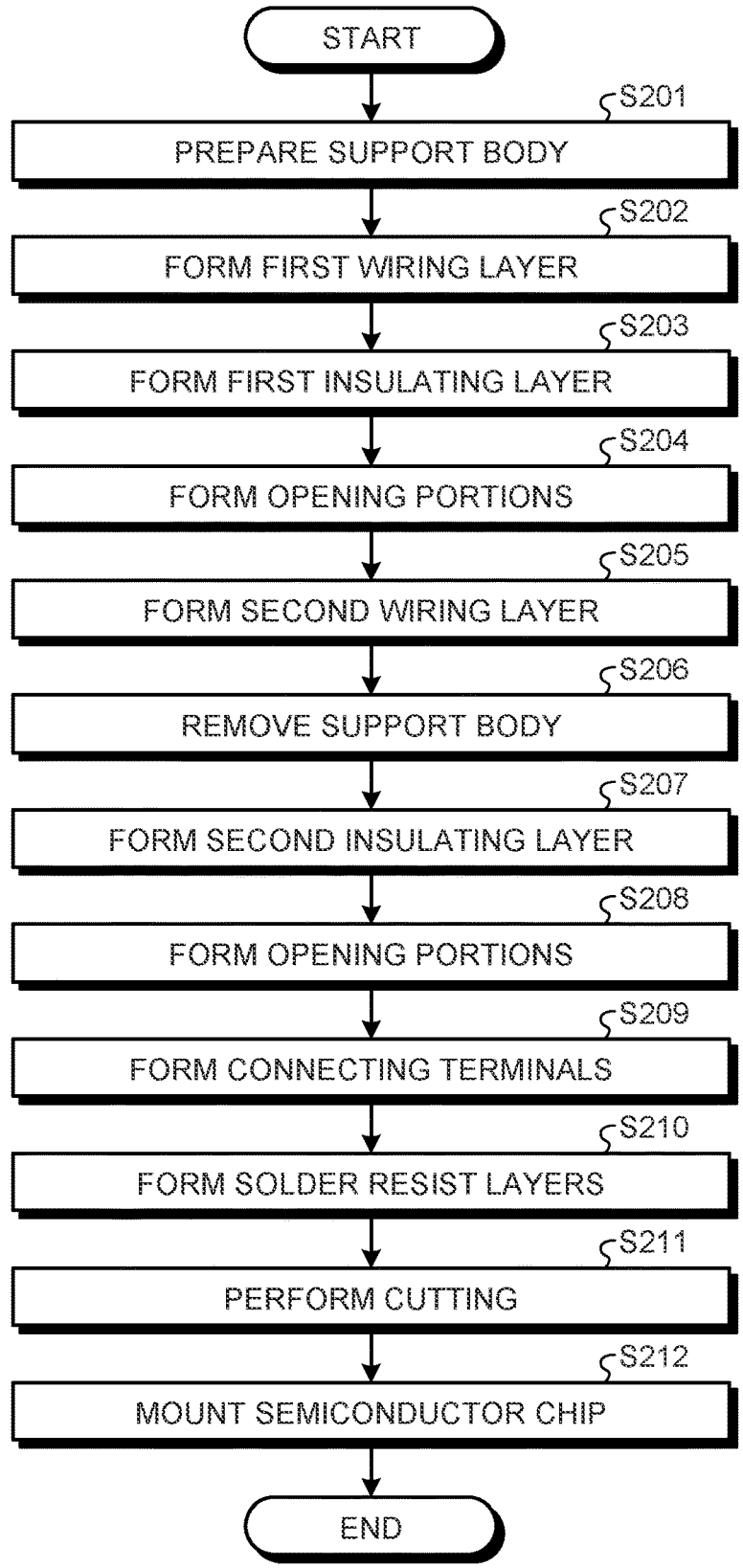
FIG. 17 is a flowchart of illustrating an example of the flow of a semiconductor device manufacturing method according to the modification.

A method of manufacturing a semiconductor device including the wiring board 10 configured as described above will be described below by using a specific example with reference to FIG. 17. FIG. 17 is a flowchart illustrating an example of the flow of a semiconductor device manufacturing method according to the modification. Meanwhile, in FIG. 17, processes from Steps S201 to S206 are the same as the processes from Steps S101 to S106 in FIG. 3, and therefore, detailed explanation thereof will be omitted.

Figure 18:
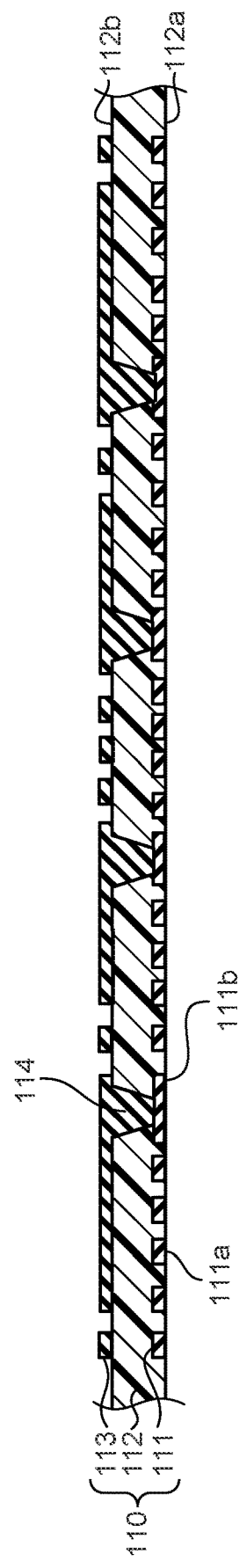
FIG. 18 is a diagram illustrating a specific example of a process of removing a support body.

After the first layer 110 is formed, the support body 500 is removed from the first layer 110 (Step S206). Accordingly, as illustrated in FIG. 18 for example, the upper surface 112*a* of the first insulating layer 112 is exposed, and the wiring patterns 111*a* and the pads 111*b* of the first wiring layer 111 are exposed on the upper surface 112*a* of the first insulating layer 112. FIG. 18 is a diagram illustrating a specific example of a process of removing the support body.

Figure 19:
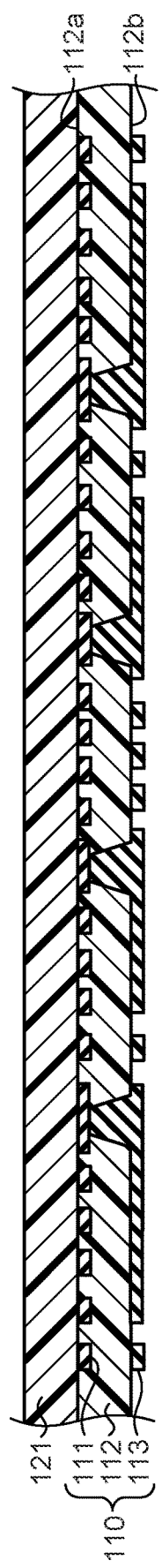
FIG. 19 is a diagram illustrating a specific example of a process of forming a second insulating layer.

After the support body 500 is removed, the second insulating layer 121 is formed on the upper surface 112*a* of the first insulating layer 112 (Step S207). Specifically, as illustrated in FIG. 19 for example, the second insulating layer 121 that is made of non-photosensitive and thermosetting resin with heat resistant property, such as epoxy resin, polyimide resin, or cyanate resin, is laminated on the upper surface 112*a* of the first insulating layer 112. FIG. 19 is a diagram illustrating a specific example of a process of forming the second insulating layer. In FIG. 19, the structural body illustrated in FIG. 18 is illustrated in an upside-down manner.

Figure 20:
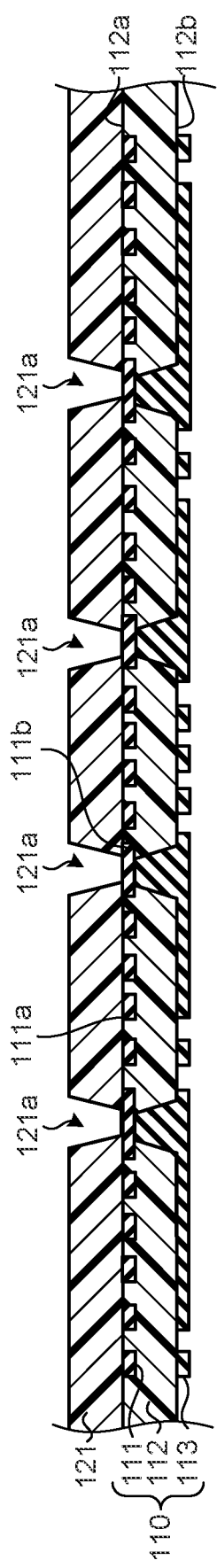
FIG. 20 is a diagram illustrating a specific example of a process of forming opening portions.

Then, as illustrated in FIG. 20 for example, the opening portions 121*a* are formed by, for example, laser processing at positons at which the connecting terminals 410 for a semiconductor chip are arranged on the second insulating layer 121 at a side at which the semiconductor chip is to be mounted (Step S208). FIG. 20 is a diagram illustrating a specific example of a process of forming the opening portions. The pad 111*b* of the first wiring layer 111 is exposed on the bottom surface of the opening portion 121*a*. Each of the opening portions 121*a* has a tapered shape in which the width (diameter) is reduced from the upper surface of the second insulating layer 121 to the pad 111*b* of the first wiring layer 111.

Figure 21:
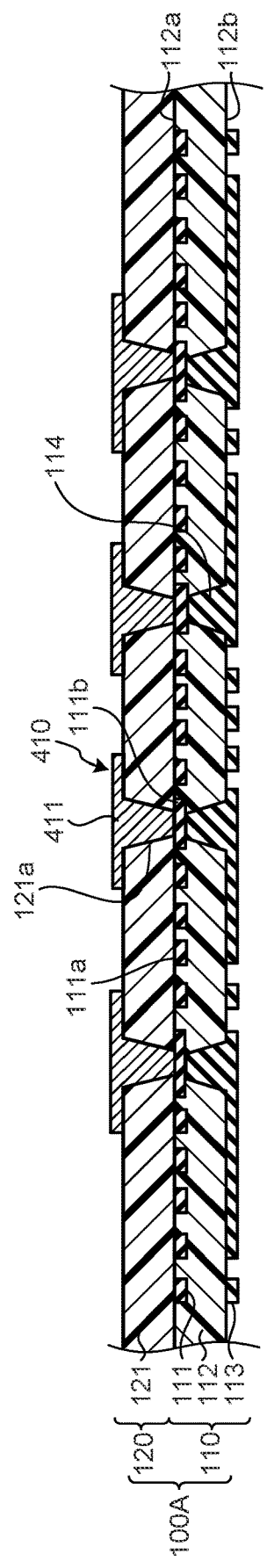
FIG. 21 is a diagram illustrating a specific example of a process of forming connecting terminals.

Further, the connecting terminals 410 are formed in the opening portions 121*a* of the second insulating layer 121 (Step S209). The connecting terminals 410 are formed by, for example, a semi-additive method. Specifically, a seed layer is formed by, for example, performing electroless copper plating on inner wall surfaces of the opening portions 121*a* and the upper surface of the second insulating layer 121. Subsequently, a plating resist layer in which openings are arranged in the connecting terminal formation portions is formed on the seed layer. Then, for example, electrolytic copper plating is performed on the seed layer that is exposed from the openings of the plating resist layer, so that an electroplating layer is formed. Subsequently, the plating resist layer is removed. Thereafter, the seed layer that is exposed from the electroplating layer is removed by etching, so that the connecting terminals 410 are formed. As illustrated in FIG. 21 for example, the connecting terminals 410 are connected to the pads 111*b* of the first wiring layer 111 at the positions of the opening portions 121*a* in the second insulating layer 121. FIG. 21 is a diagram illustrating a specific example of a process of forming the connecting terminals.

At the time of forming the connecting terminals 410, the top portions 411 that have larger widths (diameters) than the pads 111*b* of the first wiring layer 111 are formed on the upper surface of the second insulating layer 121. In other words, the electrolytic copper plating is deposited so as to extend to a predetermined range around each of the opening portions 121*a* on the upper surface of the second insulating layer 121, so that the top portion 411 with a larger width (diameter) than the pad 111*b* of the first wiring layer 111 is formed. For example, when the plurality of wiring patterns 111*a* are located around the pad 111*b* of the first wiring layer 111, the top portion 411 of the connecting terminal 410 extends to a position overlapping with at least one of the wiring patterns 111*a* on the upper surface of the second insulating layer 121 in a plan view. With this configuration, the surface area of the top portion 411 of the connecting terminal 410 becomes larger than the surface area of the pad 111*b* of the first wiring layer 111. As a result, when a semiconductor chip is mounted above the connecting terminals 410 for example, a contact area between each of the top portions 411 of the connecting terminals 410 and each of electrodes of the semiconductor chip is relatively large, so that it is possible to improve bond strength with the semiconductor chip on the connecting terminals 410.

Furthermore, each of the opening portions 121*a* has a tapered shape in which the width (diameter) is reduced from the upper surface of the second insulating layer 121 to the pad 111*b* of the first wiring layer 111, so that a portion of the connecting terminal 410 located inside the opening portion 121*a* has a tapered shape that conforms to the opening portion 121*a*. In other words, the portion of the connecting terminal 410 located inside the opening portion 121*a* has the tapered shape in which the width (diameter) is reduced from the top portion 411 to the pad 111*b* of the first wiring layer 111. The tapered shape of the portion of the connecting terminal 410 located inside the opening portion 121*a* is an inverted tapered shaped as compared to the tapered shape of the via 114 that connects the second wiring layer 113 and the pad 111*b* of the first wiring layer 111. With this configuration, even if the width (diameter) of the pad 111*b* of the first wiring layer 111 is relatively small, it is possible to reliably connect the connecting terminal 410 and the via 114 to the pad 111*b*, so that it is possible to improve miniaturization of arrangement of the wiring patterns 11*a* around the pad 111*b*.

With formation of the connecting terminals 410, the build-up layer 100A that includes the first layer 110 and the second layer 120 is completed. Further, the second layer 120 that is the outermost layer at the side of the upper surface of the build-up layer 100A is covered by the solder resist layer 200, and the second wiring layer 113 of the first layer 110 that is the outermost layer at the side of the lower surface of the build-up layer 100A is covered by the solder resist layer 300 (Step S210).

Figure 22:
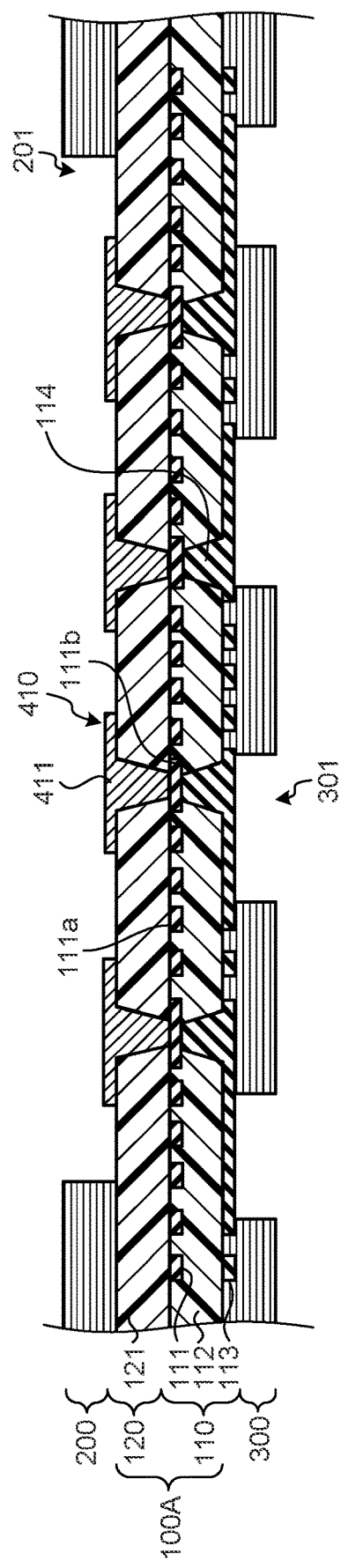
FIG. 22 is a diagram illustrating a specific example of a process of forming solder resist layers.

Furthermore, as illustrated in FIG. 22 for example, the opening portion 201 is formed at a position corresponding to a mounting surface of a semiconductor chip on the solder resist layer 200 at a side corresponding to the mounting surface of the semiconductor chip. The top portions 411 of the connecting terminals 410 are exposed from the bottom surface of the opening portion 201. In contrast, the opening portion 301 is formed at a position at which an external connecting terminal is arranged on the solder resist layer 300 at a side at which an external component, an external device, or the like is to be connected. The second wiring layer 113 is exposed on the bottom surface of the opening portion 301. FIG. 22 is a diagram illustrating a specific example of a process of forming the solder resist layers.

If photosensitive resin is used as the solder resist layers 200 and 300, it is possible to form the opening portions 201 and 301 by exposure and development. Further, if non-photosensitive resin is used as the solder resist layers 200 and 300, it is possible to form the opening portions 201 and 301 by laser processing.

Figure 23:
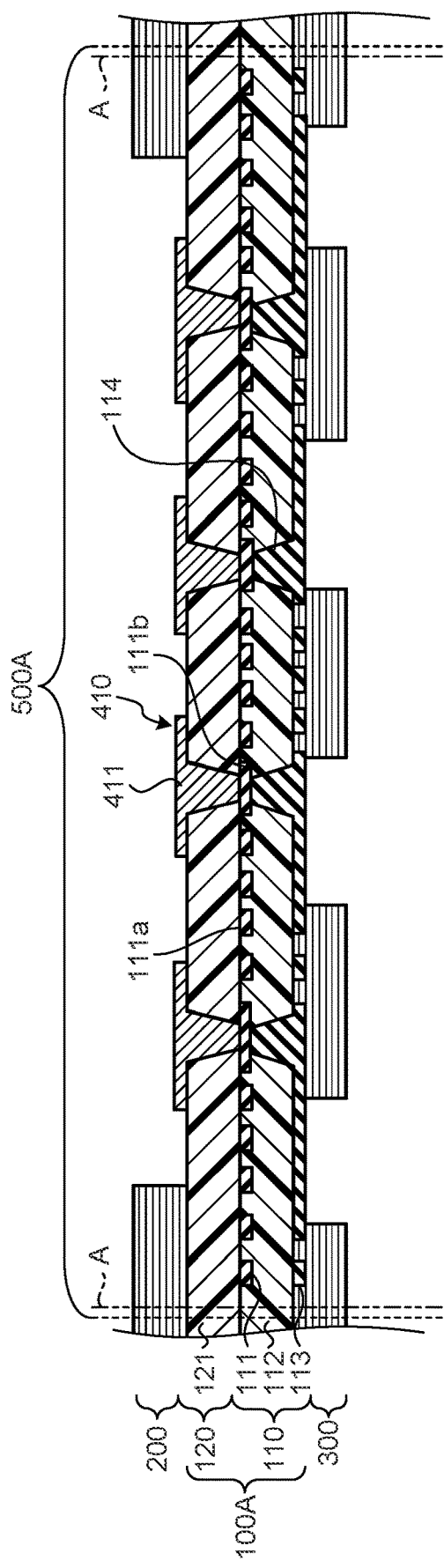
FIG. 23 is a diagram illustrating a specific example of a cutting process.

Through the processes as described above, as illustrated in FIG. 23 for example, an intermediate structure that has the same structure as the wiring board 10 is obtained. The intermediate structure is configured with an assembly that includes the plurality of wiring boards 10, and therefore, cutting is performed to cut out each of the wiring boards 10 (Step S211). Specifically, the intermediate structure as illustrated in FIG. 23 is cut by, for example, a dicer or a slicer along the cutting lines A that are located inside the area corresponding to each of the wiring board formation areas 500A, so that the wiring board 10 is obtained. FIG. 23 is a diagram illustrating a specific example of a cutting process.

Figure 24:
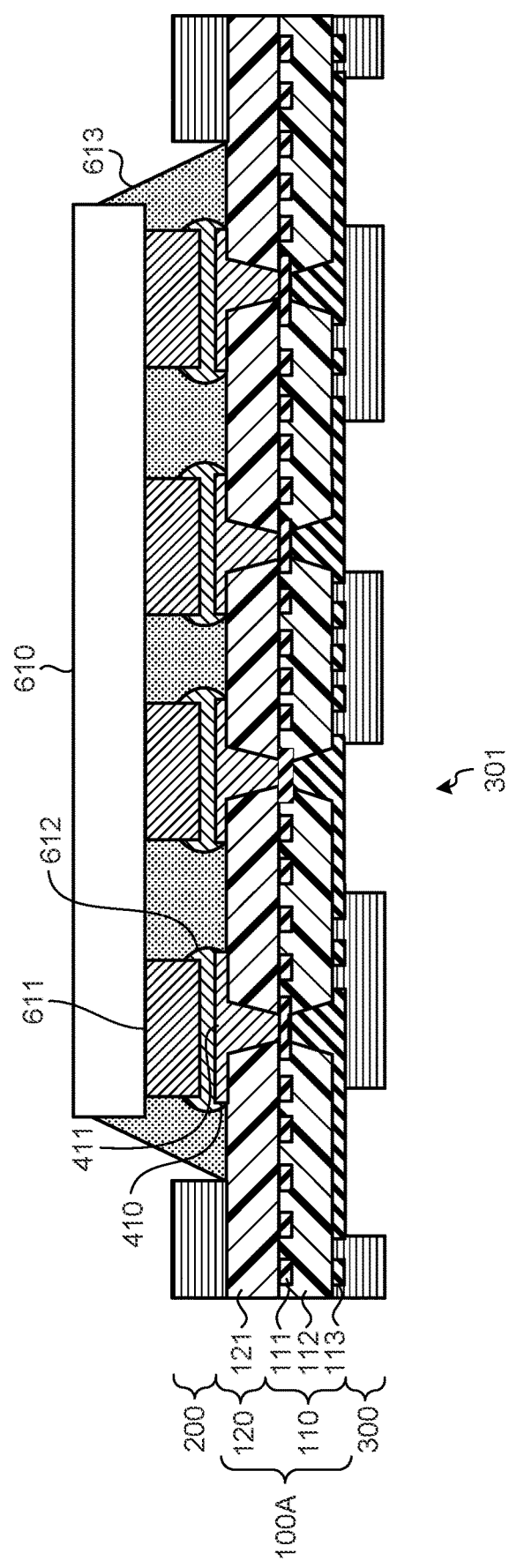
FIG. 24 is a diagram illustrating a specific example of a process of mounting a semiconductor chip.

Further, a semiconductor chip is mounted on the build-up layer 100A at the side of the second layer 120 (that is, the second insulating layer 121) (Step S212), and the connecting terminals 410 and electrodes of the semiconductor chip are connected to each other. FIG. 24 is a diagram illustrating a specific example of a process of mounting a semiconductor chip.

Specifically, as illustrated in FIG. 24, the semiconductor chip 610 is mounted above the connecting terminals 410, and the electrodes 611 of the semiconductor chip 610 are bonded to the top portions 411 of the connecting terminals 410 by, for example, the solders 612 or the like. At this time, the width of each of the top portions 411 of the connecting terminals 410 is larger than the width of each of the pads 111b of the first wiring layer 111, so that a connection area between each of the top portions 411 of the connecting terminals 410 and each of the electrodes 611 of the semiconductor chip 610 is increased. As a result, it is possible to improve bond strength between the connecting terminals 410 and the semiconductor chip 610. Further, at this time, each of the top portions 411 of the connecting terminals 410 protrudes upward relative to the upper surface of the second insulating layer 121, so that an upper surface and side surfaces of each of the top portions 411 are covered by the solder 612.

Furthermore, bonded portions between the electrodes 611 and the top portions 411 of the connecting terminals 410 are sealed with the underfill resin 613, so that a semiconductor device in which the semiconductor chip 610 is mounted on the wiring board 10 is completed. In the bonded portions between the electrodes 611 and the top portions 411 of the connecting terminals 410, the upper surfaces and the side surfaces of the top portion 411 are covered by the solders 612. Therefore, in the semiconductor device, as compared to a configuration in which the top portions 411 are embedded in the second insulating layer 121 and only the upper surfaces of the top portions 411 are covered by solders, it is possible to improve the bond strength between the electrodes 611 and the top portions 411 of the connecting terminals 410. Meanwhile, it may be possible to form an external connecting terminal, such as a solder ball, in the opening portion 301 of the solder resist layer 300. Moreover, it may be possible to use a portion of the second wiring layer 113 exposed from the opening portion 301 of the solder resist layer 300 as an external connecting terminal without providing a solder ball.

As described above, in the wiring board according to the modification, the connecting terminal is formed on the opening portion of the second insulating layer, is connected to the pad of the first wiring layer, has one end that protrudes from the opening portion of the second insulating layer, and includes, at the one end, a top portion (for example, the top portion 411) that has a larger width than the pad of the first wiring layer. With this configuration, according to the wiring board of the modification, it is possible to improve bond strength with an electronic component (for example, the semiconductor chip 610). Furthermore, according to the wiring board of the modification, it is possible to reduce the number of layers in the build-up layer (for example, the build-up layer 100A) as compared to the wiring board of the embodiment, so that it is possible to reduce a size in a thickness direction.

Other Modifications

In the embodiment and the modification as described above, each of the build-up layers 100 and 100A has the two or the three layers, but a build-up layer may be configured by laminating four or more layers. In this case, it is sufficient to sequentially laminate layers with the same configurations as the third layer 130 below the first layer 110 of each of the build-up layers 100 and 100A.

According to one embodiment of the wiring board disclosed in the present application, it is possible to improve bond strength with an electronic component.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

Note (1) A wiring board manufacturing method comprising:
   forming, on a support body, a first wiring layer including a wiring pattern and a pad;
   forming, on the support body, a first insulating layer that covers the first wiring layer;
   removing the support body to expose surfaces of the wiring pattern and the pad from an upper surface of the first insulating layer;
   forming a second insulating layer on the upper surface of the first insulating layer;
   forming an opening portion that penetrates through the second insulating layer to the pad;
   forming a connecting terminal in the opening portion, the connecting terminal connecting to the pad and having one end protruding from the opening portion, wherein
   the forming the connecting terminal includes forming the connecting terminal that includes, at the one end protruding from the opening portion of the second insulating layer, a top portion having a larger width than the pad of the first wiring layer.

(2) The wiring board manufacturing method according to the note (1), further comprising:
   forming, before removing the support body, an opening portion that penetrates through the first insulating layer to the pad; and
   forming a second wiring layer on a lower surface of the first insulating layer in which the opening portion is formed, wherein
   at the forming the second wiring layer, a via that penetrates through the first insulating layer is formed in the opening portion of the first insulating layer and the second wiring layer and the pad is connected via the via.

(3) The wiring board manufacturing method according to the note (2), further comprising:

forming a third insulating layer on the lower surface of the first insulating layer, the third insulting layer covering the second wiring layer;

forming an opening portion that penetrates through the third insulating layer to the second wiring layer; and forming a third wiring layer on a lower surface of the third insulating layer, wherein the forming the second insulating layer is performed in parallel to the forming the third insulating layer, the forming the opening portion in the second insulating layer is performed parallel to the forming the opening portion in the third insulating layer, the forming the connecting terminal is performed parallel to the forming the third wiring layer, and at the forming the third wiring layer, a via is formed in the opening portion of the third insulating layer, the via penetrating through the third insulating layer and the third wiring layer and the second wiring layer is connected via the via.

(4) The wiring board manufacturing method according to the note (1), wherein

The first insulating layer covers back surfaces and side surfaces of the wiring pattern and the pad.

What is claimed is:

1. A wiring board comprising:
a first wiring layer including a pad and a plurality of wiring patterns that are located around the pad;
a first insulating layer that covers the first wiring layer and exposes, from an upper surface thereof, surfaces of the plurality of wiring patterns and the pad;
a second insulating layer that is formed on the upper surface of the first insulating layer;
an opening portion that penetrates through the second insulating layer to the pad; and
a connecting terminal that is formed in the opening portion, that is connected to the pad, that has one end protruding from the opening portion, and that includes, at the one end, a top portion having a larger width than the pad,
wherein the top portion has an upper surface and a side surface that are not covered by another insulating layer,
the plurality of wiring patterns include two or more wiring patterns that sandwich the pad, and
the top portion of the connecting terminal extends to a position overlapping with the two or more wiring patterns on the upper surface of the second insulating layer in a plan view.

2. The wiring board according to claim 1, further comprising:
a second wiring layer that is formed on a lower surface of the first insulating layer; and
a via that penetrates through the first insulating layer and connects the second wiring layer and the pad.

3. The wiring board according to claim 2, wherein
a portion of the connecting terminal located inside the opening portion has a tapered shape in which a width is reduced from the top portion to the pad, and
the via has a tapered shape in which a width is reduced from the second wiring layer to the pad.

4. The wiring board according to claim 2, further comprising:
a third insulating layer that is formed on the lower surface of the first insulating layer and covers the second wiring layer;
a third wiring layer that is formed on a lower surface of the third insulating layer; and
a via that penetrates through the third insulating layer and connects the third wiring layer and the second wiring layer.

5. The wiring board according to claim 1, wherein
the first insulating layer covers back surfaces and side surfaces of the wiring pattern and the pad.

6. The wiring board according to claim 1, further comprising:
a solder resist layer that is formed on the upper surface of the second insulating layer, wherein
the solder resist layer has an opening portion formed at a position corresponding to a mounting surface of an electronic component on the upper surface of the second insulating layer and exposing the mounting surface, and
the upper surface and the side surface of the top portion are exposed in the opening portion of the solder resist layer.

7. The wiring board according to claim 6, wherein
an entirety of the mounting surface is exposed in the opening portion of the solder resist layer.

8. The wiring board according to claim 6, wherein
the connecting terminal includes a plurality of connecting terminals located in the opening portion of the solder resist layer, and
the upper surface and the side surface of the top portion of each of the plurality of connecting terminals are exposed in the opening portion of the solder resist layer.

* * * * *